United States Patent
Danneville et al.

(10) Patent No.: US 12,159,220 B2
(45) Date of Patent: Dec. 3, 2024

(54) SWITCHED ARTIFICIAL SYNAPSE

(71) Applicants: Universite De Lille, Lille (FR); CENTRALE LILLE INSTITUT, Mlleneuve d'Ascq (FR); Universite Polytechnique Hauts-De-France, Valenciennes (FR); Centre National De La Recherche Scientifique, Paris (FR); YNCREA Hauts De France, Lille (FR)

(72) Inventors: Francois Danneville, Lille (FR); Alain Cappy, Genech (FR); Ilias Sourikopoulos, Mons en Baroeul (FR); Christophe Loyez, Festubert (FR)

(73) Assignees: Universite De Lille, Lille (FR); CENTRE LILLIE INSTITUT, Villeneuve d'Ascq (FR); VILLENEUVE D'ASCQ, Valenciennes (FR); Centre National De La Recherche Scientifique, Paris (FR); YNCREA Hauts De France, Lille (FR)

( * ) Notice: Subject to any disclaimer, the term of this patent is extended or adjusted under 35 U.S.C. 154(b) by 996 days.

(21) Appl. No.: 17/054,993

(22) PCT Filed: May 13, 2019

(86) PCT No.: PCT/EP2019/062223
§ 371 (c)(1),
(2) Date: Nov. 12, 2020

(87) PCT Pub. No.: WO2019/219618
PCT Pub. Date: Nov. 21, 2019

(65) Prior Publication Data
US 2021/0216856 A1    Jul. 15, 2021

(30) Foreign Application Priority Data
May 14, 2018 (FR) ..................... 18 54010

(51) Int. Cl.
*G06N 3/065* (2023.01)
*G06N 3/044* (2023.01)
(Continued)

(52) U.S. Cl.
CPC ............. *G06N 3/065* (2023.01); *G06N 3/044* (2023.01); *G06N 3/049* (2013.01); *G06N 3/06* (2013.01); *G11C 11/41* (2013.01); *G11C 11/54* (2013.01)

(58) Field of Classification Search
CPC ........ G06N 3/065; G06N 3/044; G06N 3/049; G06N 3/06; G06N 3/088; G11C 11/41; G11C 11/54
See application file for complete search history.

(56) References Cited

U.S. PATENT DOCUMENTS

2019/0130258 A1* 5/2019 Cappy .................... G06N 3/065

FOREIGN PATENT DOCUMENTS

FR          3050050 A1    10/2017
WO    WO-2017178352 A1 * 10/2017 ............. G06N 3/049

OTHER PUBLICATIONS

J.V. Arthur et al., "Learning in Silicon: Timing is Everything", Proceedings of the 19th Annual Conference on Neural Information Processing Systems (NIPS'05), Dec. 5, 2005 (Dec. 5, 2005) (8 pages). (Year: 2005).*

(Continued)

*Primary Examiner* — Karen Kusumakar
*Assistant Examiner* — Shawn Shaw Muslim
(74) *Attorney, Agent, or Firm* — Shumaker, Loop & Kendrick, LLP

(57) ABSTRACT

Electronic neural circuit including at least one pre-neuron having an output voltage $VA_{out}$, and at least one post-neuron that are linked by at least one excitatory synapse having at least one switching input, wherein the excitatory synapse is (Continued)

Figure 1:
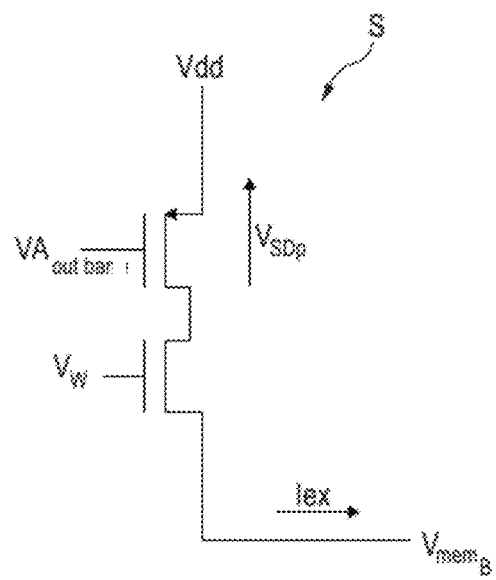

supplied with power by the output $VA_{out}$, and receives, on its switching input, a switching signal $VA_{out\_bar}$ whose state is complementary to that of the output $VA_{out}$.

24 Claims, 11 Drawing Sheets

(51) Int. Cl.
*G06N 3/049* (2023.01)
*G06N 3/06* (2006.01)
*G11C 11/41* (2006.01)
*G11C 11/54* (2006.01)

(56) References Cited

OTHER PUBLICATIONS

S. Patil, K. Zhou and A. C. Parker, "Neural circuits for touch-induced locomotion in Caenorhabditis elegans," 2015 International Joint Conference on Neural Networks (IJCNN), Killarney, Ireland, 2015, pp. 1-8, doi: 10.1109/IJCNN.2015.7280408, cited in IDS (Year: 2015).*

International Search Report (ISR) for PCT/EP2019/062223 mailed Aug. 12, 2019 (7 pages).

S. Patel et al., "Neural Circuits for Touch-Induced Locomotion in Caenorhabditis Elegas", Proceedings of the 2015 International Joint Conference on Neural Networks (KJCNN'15), Jul. 12, 2015 (Jul. 12, 2015) (8 pages).

J.V. Arthur et al., "Learning in Silicon: Timing is Everything", Proceedings of the 19th Annual Conference on Neural Information Processing Systems (NIPS'05), Dec. 5, 2005 (Dec. 5, 2005) (8 pages).

Indiveri et al., "Neuromorphic silicon neuron circuits", Frontiers in Neuroscience, vol. 5, May 31, 2011 (May 31, 2011) (23 pages).

C. Mead, "Neuromorphic Electronic Systems", Proceedings of the IEEE, vol. 78, No. 10, Oct. 1990, (pp. 1629-1636).

E. Farquhar et al., "A BioPhysically Inspired Silicon Neuron", IEEE Transactions on Circuits and Systems—I: Regular Papers, vol. 52, No. 3, Mar. 2005, (pp. 477-488).

A. van Schaik, "Building blocks for electronic spiking neural networks", Neural Networks, vol. 14, Jan. 31, 2001, (pp. 617-628).

Chicca et al., "Neuromorphic Electronic Circuits for Building Autonomous Cognitive Systems", Proceedings of the IEEE, vol. 102, No. 9, Sep. 2014 (pp. 1367-1388).

Indiveri, "Neuromorphic electronic circuits as key enables of autonomous cognitive agents", Institute of Neuroinformatics, University of Zurich and ETH Zurich, Mar. 8, 2016 (34 pages).

Zhao et al., "Spike-Time-Dependent Encoding for Neuromorphic Processors", ACM Journal on Emerging Technologies in Computing Systems, vol. 12, No. 3, Article 23, Pub. date Sep. 2015 (22 pages).

* cited by examiner

State Of The Art

SWITCHED ARTIFICIAL SYNAPSE

TECHNICAL FIELD AND BACKGROUND

The present invention relates to a circuit with low energy consumption that is able to reproduce certain electrical properties of a biological synapse, and that is able to be used in particular in bioinspired architectures.

More precisely, the invention relates to a novel artificial synapse switching topology with low power consumption, able to be associated with high-energy-efficiency artificial neurons.

Numerous works have been carried out for modelling the biological behaviour of neurons, such as the two IEEE articles C. Mead et al. "Neuromorphic electronic systems", 1990 and E. Farquhar et al. "A bio-physically inspired silicon neuron", 2005.

Application FR 3 050 050 describes synaptic circuits, using conventional CMOS technology, which are associated with artificial neurons whose energy consumption is of the order of the fJ per action potential.

The article by J. Arthur and K. Boahen "Learning in silicon: timing is everything", Advances in Neuronal Information Processing Systems, 2006 proposes a CMOS circuit modelling the plasticity of a synapse.

An excitatory synapse contributes to the triggering of an action potential by a neuron to which it is connected downstream, called post-neuron. A conventional excitatory artificial synapse preferably includes a PMOS transistor who source is connected to a DC power supply ($V_{dd}$) and whose drain is linked to a capacitor, called membrane capacitance, of the post-neuron. The gate of this PMOS transistor, when no action potential is applied thereto, is isolated from the conductor channel. In that respect, there is a formal analogy with a biological synapse, which has a "synaptic cleft", which isolates the axon portion coming from the pre-neuron from the dendrite portion connected to the post-neuron. As illustrated in FIG. 1 showing an excitatory synapse according to the prior art, a for example NMOS transistor may be provided whose drain is linked to that of the PMOS transistor and whose source is linked to the membrane capacitance of the post-neuron. The voltage applied to the gate of this NMOS transistor is representative of a synaptic weight. This known excitatory artificial synapse, coupled to an energy-efficient artificial neuron, such as the one described in application FR 3 050 050, has a consumption in static mode (i.e. without action potential activating the synapse) of the order of the pW, which is detrimental if it is desired to deploy large-scale neural networks, all the more so as the number of synapses may be higher than the number of neurons by several orders of magnitude. Furthermore, the leakage current from the excitatory synapse is of the order of a few pA. The sum of the currents from excitatory artificial synapses belonging to one and the same dendritic tree may be enough to trigger unwanted action potentials at the post-neuron. This generation of action potentials exhibits two major drawbacks: (i) firstly, these action potentials have no benefit in terms of information useful to the neural network, (ii) secondly, they increase power consumption. To rectify this drawback, it is possible to introduce a leak, by way of an NMOS transistor used as active load, for which the gate and the drain are linked, which is dimensioned so as to prevent the post-neuron from triggering unwanted action potentials. However, this solution is expensive in terms of implantation, requiring one additional transistor per post-neuron, and may prove difficult to implement for networks having complex architectures. In addition, it does not solve the problem in relation to static consumption.

There is not currently an excitatory synapse architecture using industrial CMOS technology that meets the following constraints in a completely satisfactory manner when the synapse is in static mode:

A consumption of the order of the fW, which guarantees a possibility of deploying the neural network on a large scale;

an architecture that intrinsically prevents the triggering of action potential of a post-neuron, regardless of the entry of the post-neuron, i.e. regardless of the number of excitatory synapses connected to the input of a post-neuron.

SUMMARY

The aim of the invention is to propose an artificial synapse structure that is able to meet these constraints in full or in part, and it achieves this, according to one of its aspects, by virtue of an electronic neural circuit including at least one pre-neuron having an output voltage $VA_{out}$, and at least one post-neuron that are linked by at least one excitatory synapse having at least one switching input, wherein the excitatory synapse is supplied with power by the output $VA_{out}$ and receives, on its switching input, a switching signal $VA_{out\_bar}$ whose state is complementary to that of the output $VA_{out}$.

"Complementary state" of a signal should be understood to mean the state in which this signal would be at the output of a logic inverter.

By virtue of the invention, the consumed power is reduced in comparison with that of a neural circuit using a known excitatory synapse, and the risk of generating an unwanted action potential at the post-neuron is reduced, or even eliminated.

The synapses that are the subject of the invention are produced using field-effect transistor technology, which transistors may be organic or CMOS, for example. The associated pre-neurons and/or post-neurons may be produced using the same technology or using a different technology. For example, the synapses are produced with organic transistors and the neurons are produced with CMOS transistors, and vice versa.

The invention makes it possible to use transistors operating in subthreshold mode. The operation of the transistors in subthreshold mode corresponds to the existence of a drain-source current that varies exponentially with the gate control voltage in the weak-inversion region or subthreshold region of the transistor, in which the gate-source voltage is below the threshold voltage for which the inversion zone appears (creation of a conduction channel between the drain and the source). It should be noted that the drain-source voltage is lower than the threshold voltage if the supply voltage $V_{dd}$ is itself lower than the threshold voltage, promoting low power consumption of the transistors.

Preferably, the excitatory synapse includes at least two field-effect transistors, preferably CMOS, whose drain-source channels are in series, so as to form a chain of transistors in series between a potential point connected to $VA_{out}$ and a potential point connected to the membrane potential of the post-neuron, the transistors situated at the ends of the chain being termed "end transistors".

The "membrane potential" denotes the potential at the terminal of the membrane capacitor of the neuron.

Preferably, the end transistor connected to $VA_{out}$ is a PMOS transistor and the end transistor connected to the membrane potential ($V_{memB}$) of the post-neuron is an NMOS transistor.

In one exemplary implementation, the chain of transistors comprises only two transistors that form the end transistors, these transistors having their sources at the same potential when $VA_{out}=0$.

Preferably, one of the end transistors, preferably a PMOS transistor, has a gate defining the switching input and the other end transistor, preferably an NMOS transistor, has a gate defining a synaptic weight potential input. The synaptic weight potential, applied to the synaptic weight potential input, may be analogue or binary, preferably taking an appropriate value from among $V_{dd}$ and 0 when the circuit is supplied with a voltage $V_{dd}$.

The synapse may include at least one third intermediate field-effect transistor, preferably CMOS, belonging to the chain of transistors, and positioned between said end transistors, the gate of this third transistor being linked to the drain or to the source of one of the end transistors. This third transistor makes it possible to control the synaptic current by adjusting its intensity.

Preferably, the supply voltage $V_{dd}$ is such that $0<V_{dd}<0.3$ V, better still $0<V_{dd}<0.25$ V, even better still $0<V_{dd}<0.2$ V.

The pre-neuron advantageously includes two inverters in cascade, called first and second conforming inverters, respectively generating the voltages $VA_{out\_bar}$ and $VA_{out}$.

The binary synaptic weight potential applied to the synaptic weight potential input is preferably obtained at the output of a synaptic weight determination circuit, this synaptic weight determination circuit possibly comprising:

A memory circuit, preferably SRAM-based ("static random access memory"), having an analogue voltage $V_{w\ analogue}$ for its input and the binary synaptic weight potential for its output, and including:

A memory cell, preferably SRAM, including two inverters, the input of one of which is connected to the output of the other, whose output is a connection point defining the binary synaptic weight potential, Two field-effect transistors, preferably CMOS, even more preferably NMOS, whose drain-source channels are in series, receiving the analogue voltage $V_{w\ analogue}$ on the gate of one of them, and the drain or the source thereof defining the input of the memory cell, and receiving the output potential $VB_{out}$ of the post-neuron on the gate of the other transistor.

A learning circuit, called STDP ("spike timing dependent plasticity"), preferably including:

Two field-effect transistors, preferably CMOS, even more preferably PMOS transistors, linked in series, the first transistor having the source connected to the output potential $VB_{out}$ of the post-neuron, the gate connected to a complementary state $VB_{out}$ bar of this potential and the drain connected to the source of the second transistor, whose drain is connected to a terminal of a first capacitor integrating the synaptic weight potential, the other terminal of this first capacitor being linked to ground, the drain of the second transistor supplying the analogue voltage $V_{w\ analogue}$ to the memory circuit, a third field-effect transistor, preferably CMOS, even more preferably PMOS, whose source is linked to the potential $VA_{out}$ of the pre-neuron, whose gate is linked to ground and whose drain is linked to a terminal of a second capacitor whose other terminal is linked to ground, and an inverter whose input is linked to the drain of the third transistor and whose output is linked to the gate of the second transistor.

The STDP learning circuit implements a protocol that expresses the plasticity of the synapse, in which the weight thereof depends on the relative positions, in the temporal domain, of the action potentials of the pre-neuron and of the post-neuron. If the action potential of the post-neuron is delayed in comparison with that of the pre-neuron, the weight will increase, and by contrast, if the action potential of the post-neuron is ahead of that of the pre-neuron, the weight will decrease.

The STDP learning circuit thus allows learning during operation of the circuit, called "online" learning, of the synaptic weight potential, in which the latter is increased or reduced depending on the delay between the action potentials of the pre-neuron and of the post-neuron.

Another possibility is what is known as "offline" learning, involving predetermining the synaptic weights outside the neural circuit, for example following a simulation performed on a computer, and then injecting them into this circuit, for example by way of an electronic memory.

As a variant, the STDP learning circuit may be produced using a memristor-based technology.

The synaptic weight determination circuit may have a symmetric replica in which the potentials $VA_{out}$ and $VB_{out}$ are swapped, the symmetry being with respect to the memory cell that is shared in common between the synaptic weight determination circuit and its replica, a binary synaptic weight potential applied to a synaptic weight potential input of an inhibitory synapse being tapped off at a connection point opposite the connection point that defines the binary synaptic weight potential of the excitatory synapse.

Preferably, the pre-neuron includes an extension sub-circuit including two inverters in cascade, called coupling inverters, followed by an integrator circuit comprising a field-effect transistor, preferably CMOS, and a capacitor, the gate of the transistor being linked to the drain forming the output of the two coupling inverters in cascade, the source of the transistor being linked to a first terminal of the capacitor whose second terminal is linked to ground, the output of the extension sub-circuit being linked to the input of the first conforming inverter.

This extension sub-circuit makes it possible to increase the duration of the excitatory post-synaptic potential (EPSP), which may be defined by a change in the value of the membrane potential of the post-neuron, in the sense of a depolarization. This sub-circuit may also be used for the hyperpolarization of a post-neuron brought about by an inhibitory synapse.

The transistor of the extension sub-circuit is preferably a CMOS transistor, even more preferably an NMOS transistor.

At least one of the pre-neuron and post-neuron may be of Morris-Lecar type, preferably including:

a capacitor, called membrane capacitance, one of the terminals of which defines a membrane potential, a pulse feedback circuit including:

a bridge of field-effect transistors, preferably CMOS, even more preferably PMOS and NMOS, in series and linked to the membrane potential by way of their drains, and at least one capacitor, called delay capacitor, between the gate and the source of one of the transistors of the bridge, and at least two field-effect inverters, preferably CMOS, in cascade, each one being formed of two transistors, the input of the first inverter being linked to the membrane capacitance and its output being linked to the input of the second inverter and to the gate of one of the transistors of the bridge, the output of the second inverter being linked to the gate of the other transistor of the bridge, or at least three field-effect inverters, preferably CMOS, two inverters of which are in cascade, each one being formed of two transistors, the input of the first inverter being linked to the membrane capacitance and its output being linked to the input of the second inverter, the output of the second inverter being linked to the gate of one of the transistors of the bridge, the input of the third inverter being linked to the membrane capacitance and the output of the third CMOS inverter being linked to the gate of the other transistor of the bridge.

Preferably, the gate widths of the transistors of the Morris-Lecar pre-neuron and/or post-neuron are between 60 nm and 10 μm, preferably between 120 nm and 2 μm, the gate lengths of these transistors are between 10 nm and 10 μm, preferably between 28 nm and 500 nm, and the values of the membrane and delay capacitances are between 1 fF and 1 pF, preferably between 4 fF and 200 fF.

At least one of the pre-neuron and post-neuron may also be of Axon-Hillock type, preferably including:
at least two inverters in cascade,
a feedback capacitor connected in parallel with said at least two inverters in cascade, and
an NMOS transistor whose drain defines a membrane potential that is the input of said at least two inverters in cascade and whose gate is linked to the output thereof, the source being linked to ground.

Preferably, the number of inverters in cascade is even.

The Axon-Hillock pre-neuron or post-neuron may furthermore include a membrane capacitance connected between the input of the first inverter and ground.

The input of the first conforming inverter is preferably connected to the membrane potential, both in the case of the Morris-Lecar neuron and in the case of the Axon-Hillock neuron.

The first conforming inverter makes it possible to have a high impedance at the output of the neuron. This makes it possible not to disrupt the membrane capacitance of the pre-neuron.

A relatively small gate width of the transistors of the first conforming inverter makes it possible to have a low intrinsic capacitance.

The pre-neuron may be connected, at its output, to several synapses defining the fanout of this neuron, i.e. the maximum number of connections or "axonal tree".

The post-neuron may receive, at input, the signals of several synapses, the maximum number of which defines the entry of the neuron.

Preferably, the gate widths of the transistors of the Axon-Hillock pre-neuron and/or post-neuron are between 60 nm and 10 μm, preferably between 120 nm and 2 μm, the gate lengths of these transistors are between 10 nm and 10 μm, preferably between 28 nm and 500 nm, and the feedback capacitance is between 1 fF and 1 pF, preferably between 4 fF and 200 fF.

These values make it possible to obtain good performance in terms of energy efficiency.

The neural circuit may furthermore include at least one inhibitory synapse comprising at least two field-effect transistors, preferably CMOS, even more preferably NMOS, whose drain-source channels are in series, one of the two transistors having its gate connected to the output voltage $VA_{out}$ of the pre-neuron, its source connected to ground and its drain connected to the source of the other transistor, the latter having its gate connected to a synaptic weight potential and its drain connected to the membrane potential of the post-neuron.

The term "capacitor" or "capacitance" may denote a capacitor in the form of a component and its electrical capacitance as a physical value, measured in farads (F).

BRIEF DESCRIPTION OF

Figure 2:
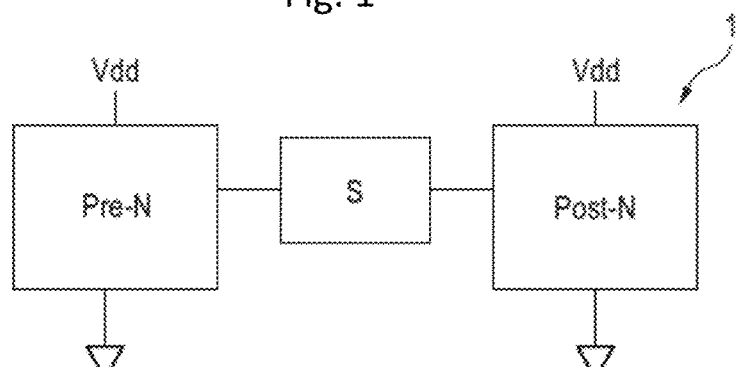
Figure 3A:
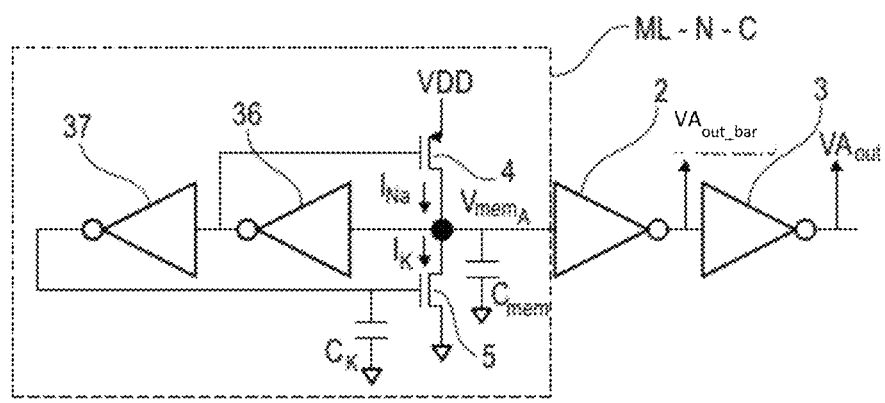
Figure 3B:
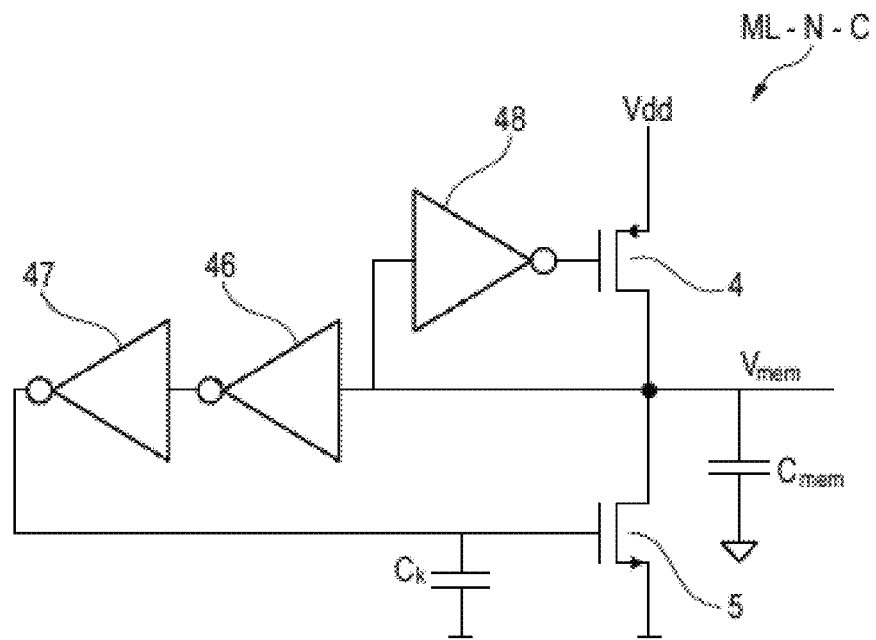
Figure 4:
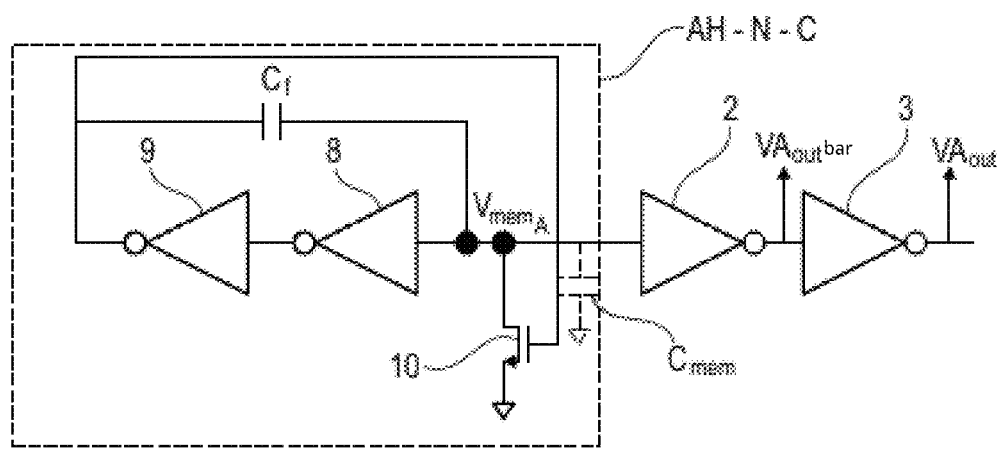
Figure 5:
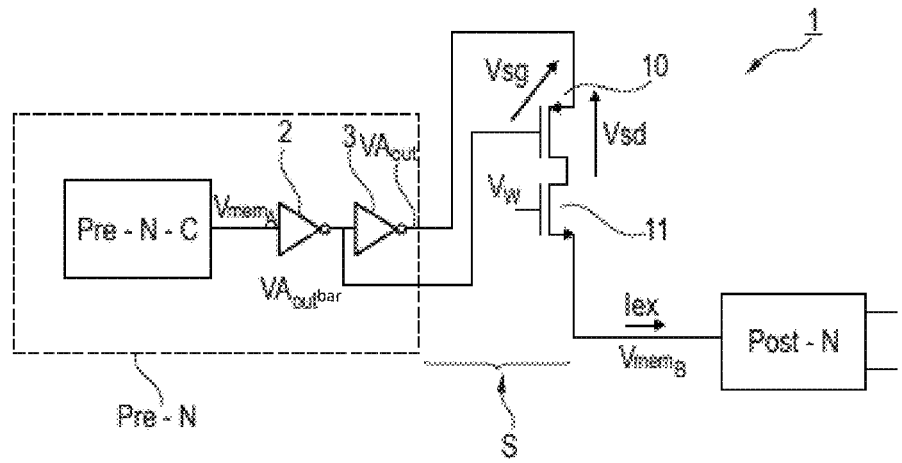
Figure 6:
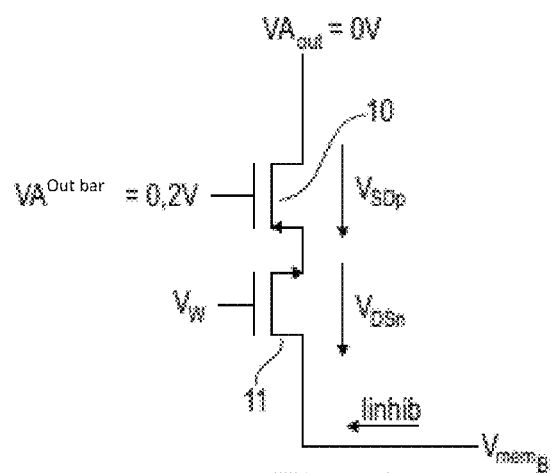
Figure 7:
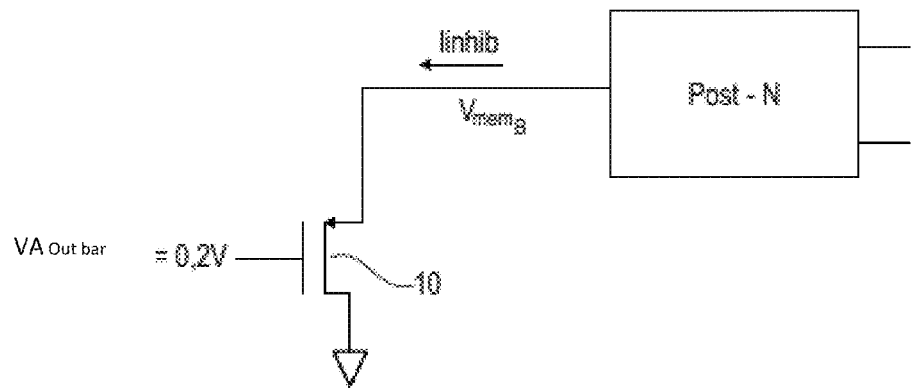
Figure 8:
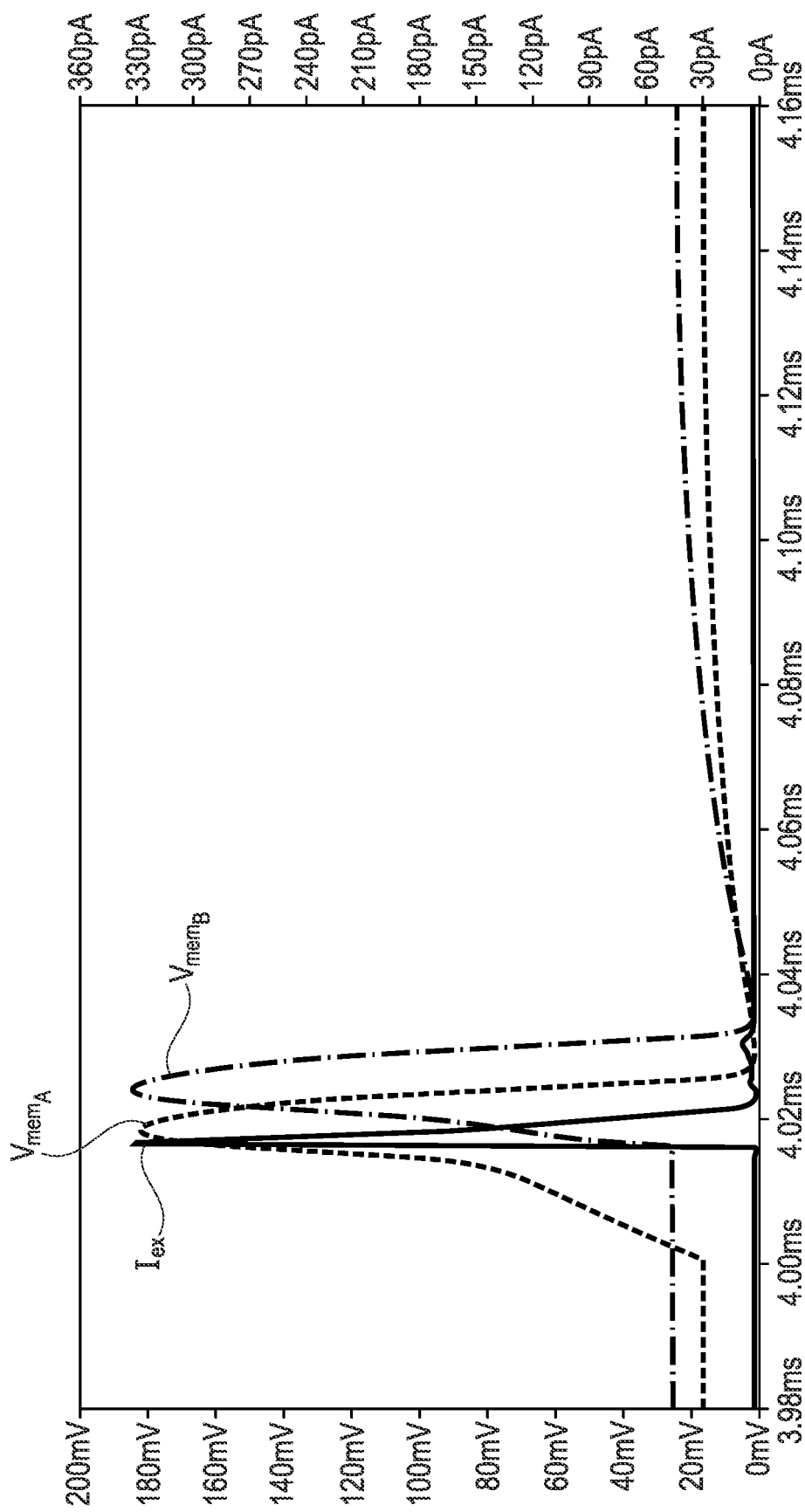
Figure 9:
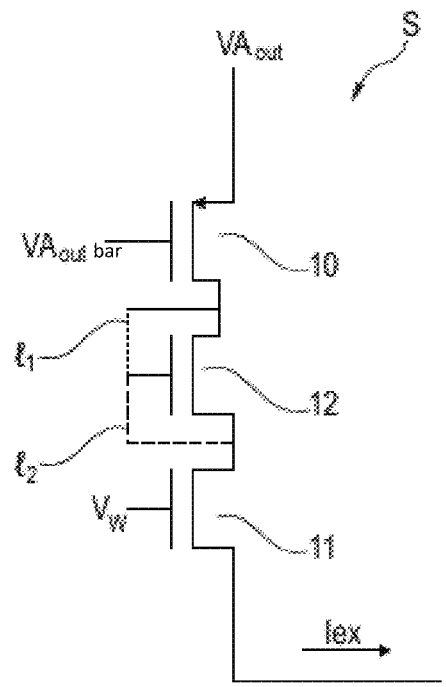
Figure 10:
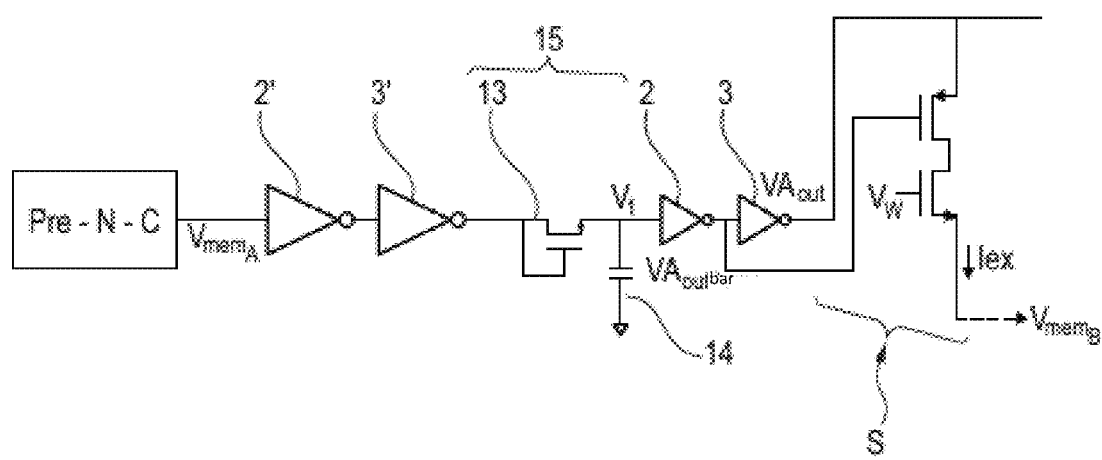
Figure 11:
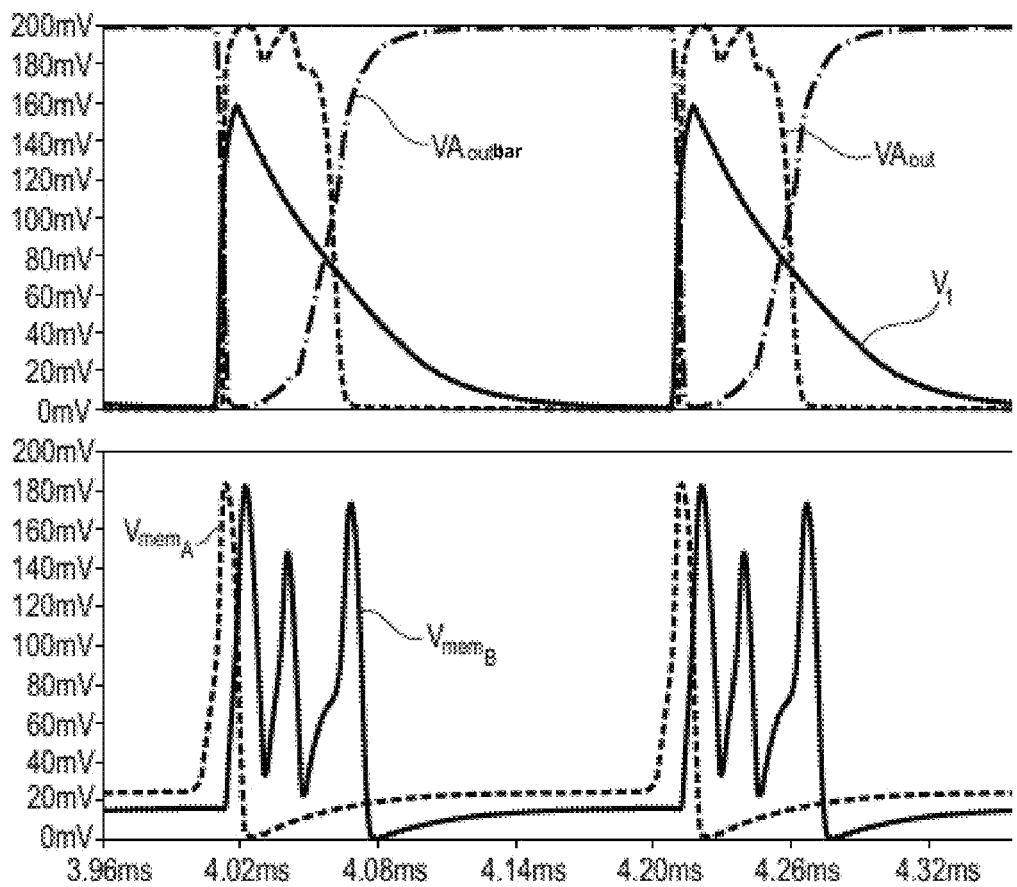
Figure 12A:
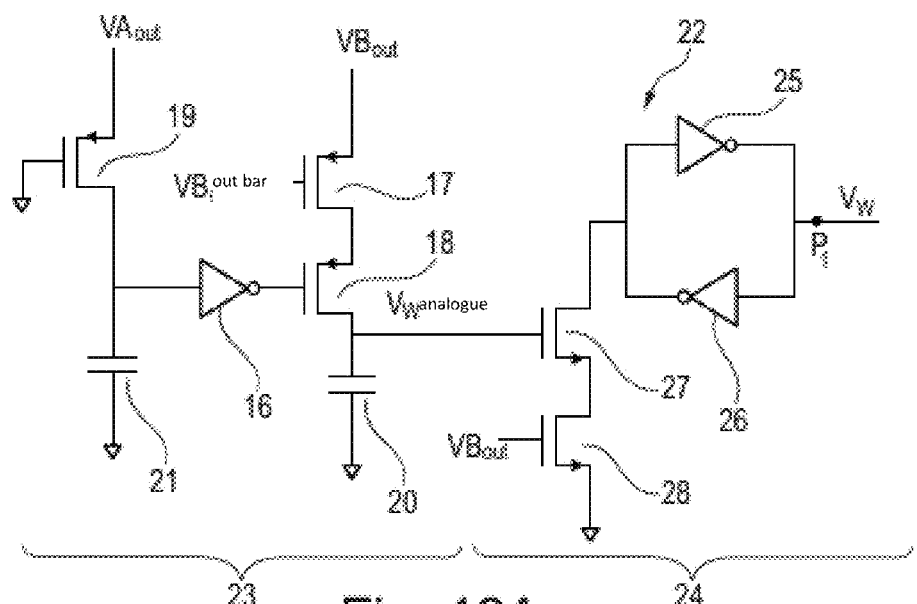
Figure 12B:
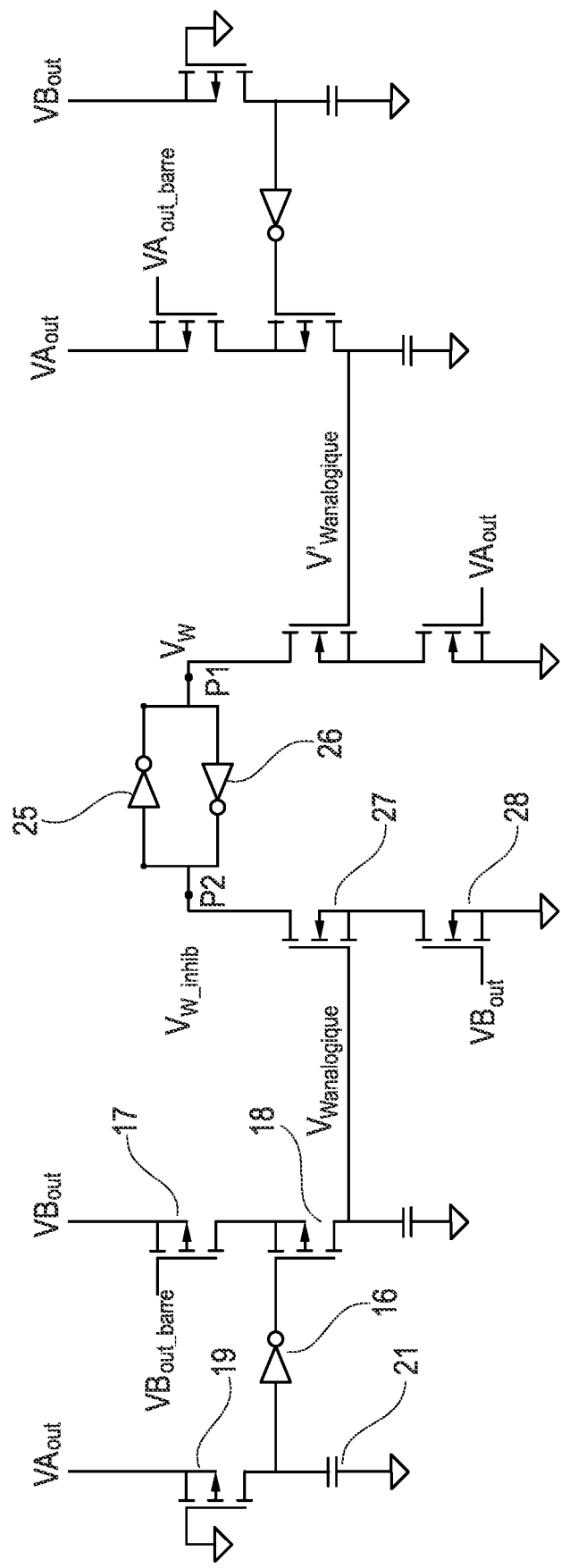
Figure 13:
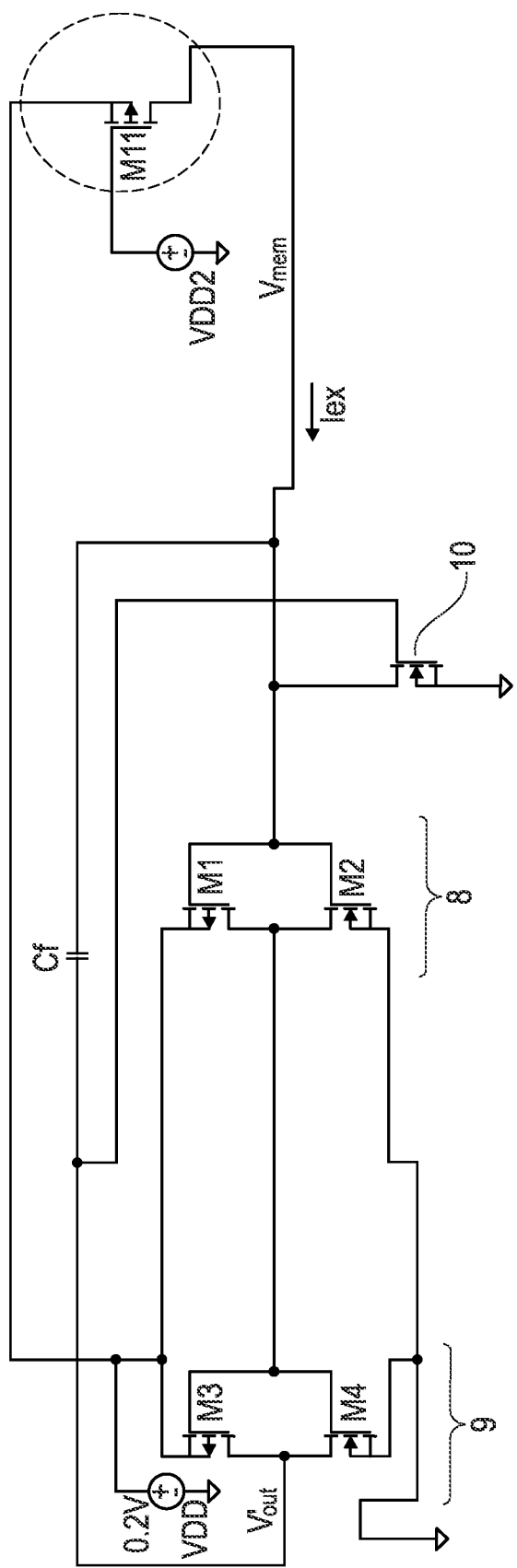
Figure 14:
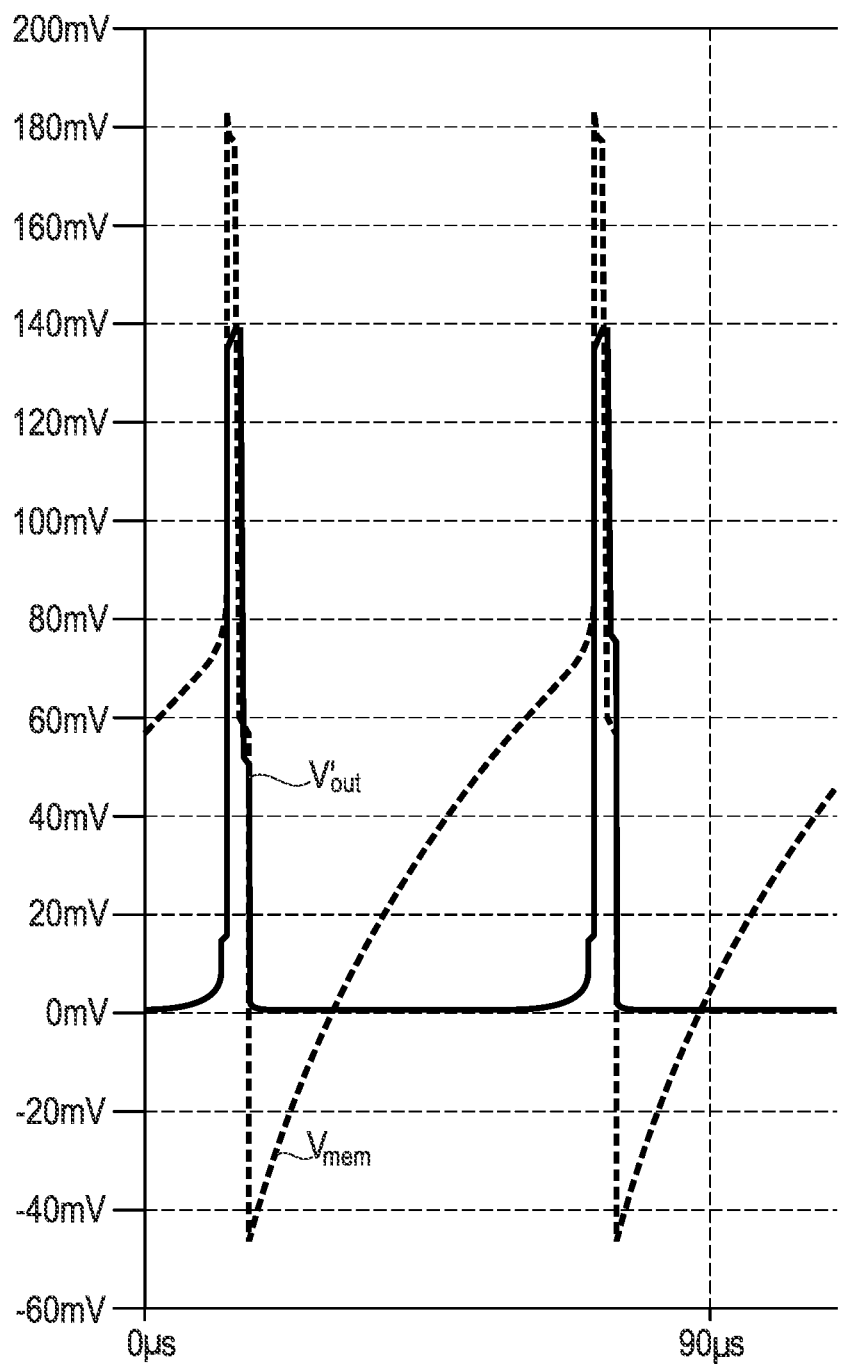
Figure 15:
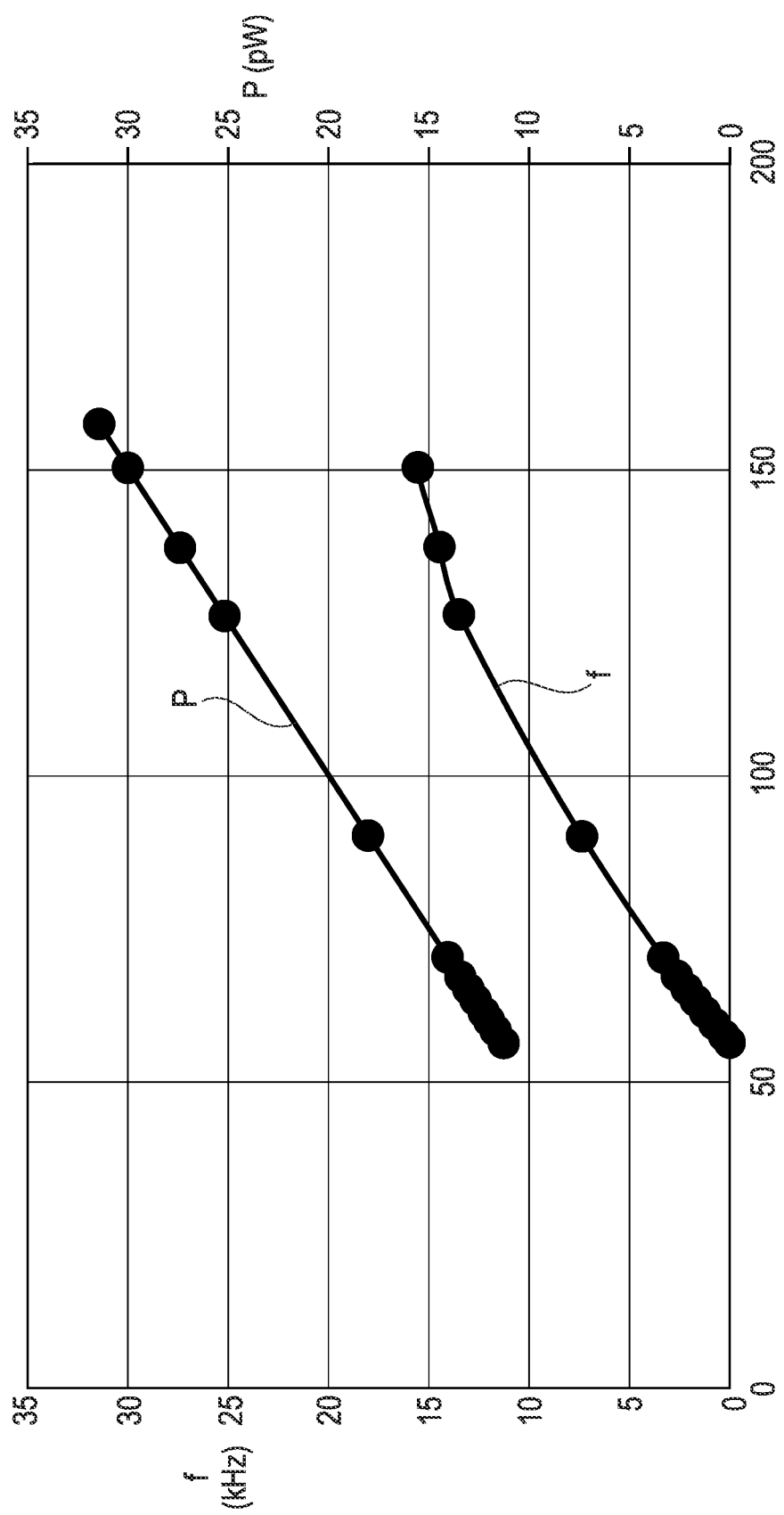
Figure 16:
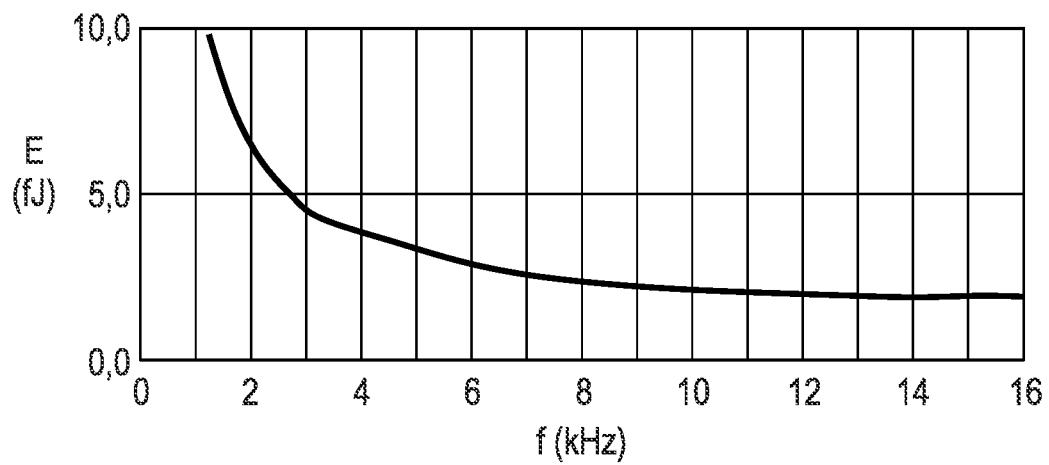
Figure 17:
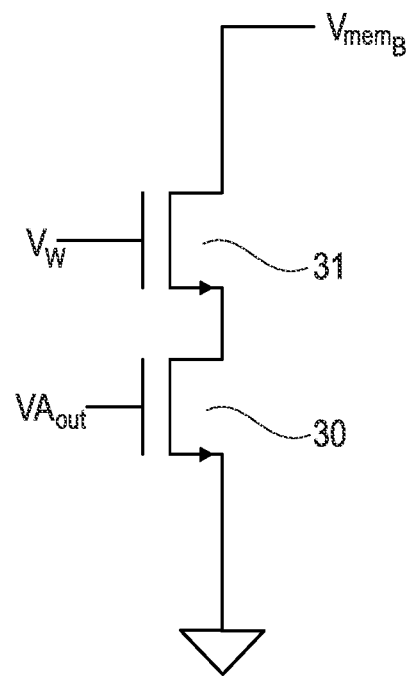

The invention will be better understood upon reading the following description of nonlimiting modes of implementation thereof and upon studying the attached drawing, in which:

FIG. 1, described above, illustrates a conventional excitatory synapse from the prior art, FIG. 2 schematically shows the interconnection between synapse and pre-neurons and post-neurons, FIGS. 3A and 3B illustrate two architecture variants of Morris-Lecar neurons, having two and having three inverters, respectively, FIG. 4 shows an Axon-Hillock neuron architecture, FIG. 5 shows a neural circuit according to a first embodiment of the invention, FIGS. 6 and 7 are equivalent circuit diagrams of a synapse according to the invention, in static mode, FIG. 8 illustrates the waveforms obtained through digital simulation of the circuit of FIG. 5 in the presence of an action potential generated by the Morris-Lecar pre-neuron, FIG. 9 shows a synapse variant according to the invention, FIG. 10 illustrates a neural circuit according to a second embodiment of the invention, able to be produced with Morris-Lecar or Axon-Hillock neurons, FIG. 11 shows the waveforms of the potentials, obtained through digital simulation of the circuit of FIG. 10, in the case of Morris-Lecar neurons, FIG. 12A illustrates an example of a synaptic weight determination circuit for an excitatory synapse, FIG. 12B supplements FIG. 12A with a symmetric synaptic weight determination circuit for an inhibitory synapse, FIG. 13 shows the digital simulation circuit diagram for the Axon-Hillock neuron, FIG. 14 illustrates the waveforms obtained from the digital simulation of the circuit of FIG. 13, FIG. 15 shows an experimental variation of the frequency of the action potentials and of the power consumed for the Axon-Hillock neuron as a function of the current delivered by the power supply, FIG. 16 illustrates the energy per action potential, taking into account the static and dynamic powers, of the Axon-Hillock neuron as a function of the frequency of the action potentials, and FIG. 17 shows an example of an inhibitory synapse that may form part of the neural circuit according to the invention.

DETAILED DESCRIPTION

FIG. 2 illustrates the principle of interconnection between a synapse S and a pre-neuron Pre-N preceding it and a post-neuron Post-N following it. Such a neural circuit 1, supplied for example with a voltage $V_{dd}$, forms the foundation of a neural network.

The pre-neuron and the post-neuron may be of Morris-Lecar or Axon-Hillock type. In both cases, the circuit includes two inverters 2 and 3 in cascade at output, respectively generating output voltages $VA_{out}$ bar and $VA_{out}$, as illustrated in FIG. 3A or FIG. 4.

FIG. 3A shows an example of a Morris-Lecar neuron core "ML-N-C" including a capacitor, called membrane capacitance $C_{mem}$, one of the terminals of which defines a membrane potential $V_{mem}$. ML-N-C also includes two transistors, PMOS 4 and NMOS 5, in series, whose drain currents $I_{Na}$ and $I_K$ respectively correspond to the sodium and potassium currents in biology, a capacitor $C_K$, called delay capacitor, between the gate of the NMOS transistor 5 and ground for generating a temporal conduction/blocking offset between the two transistors, and two CMOS inverters 36 and 37 in cascade between the membrane capacitance $C_{mem}$ and the gates of the transistors 4 and 5.

In biology, the variation of the sodium current $I_{Na}$ and of the potassium current $I_K$ as a function of the variation of the membrane potential $V_{mem}$ is of the order of 10 mV per decade of current. As the theoretical limit of the subthreshold slope of MOS transistors is 60 mV/decade, a value that is commonly observed in practice is 90 mV/decade. The inverters in cascade 36 and 37 operate as voltage amplifiers so as to achieve variations of the currents $I_{Na}$ and $I_K$ with respect to the membrane voltage variations that are similar to them in terms of biology. It is possible to demonstrate analytically that the maximum voltage gain $G_v$ of the inverters is expressed as follows:

$$Gv = \frac{\left(e^{\left(\frac{Vdd}{2*Vt}\right)} - 1\right)}{n} \cdot \frac{\left(1 + \frac{Vdd}{2*\overline{Va}}\right)}{\left(1 + \frac{Vt \cdot e^{\left(\frac{Vdd}{2*Vt}\right)}}{\overline{Va}}\right)}$$

$$Gv = \frac{\left(e^{\left(\frac{Vdd}{2*Vt}\right)} - 1\right)}{n} \cdot \frac{\left(1 + \frac{Vdd}{2*\overline{Va}}\right)}{\left(1 + \frac{Vt \cdot e^{\left(\frac{Vdd}{2*Vt}\right)}}{\overline{Va}}\right)}$$

where $\left(\overline{Va} = 2 * \frac{1}{\frac{1}{Van} + \frac{1}{Vap}}\right)$ where $Vt=k.T/q$ is the thermal voltage, n is the coefficient of ideality extracted from the characteristics $I_d=f(V_{gs})$ of the MOS transistors (n≈1.5), and $\overline{Va}$ is representative of what are known as the Early voltages of the PMOS and of the NMOS. It should be emphasized that this gain is independent of the geometry of the transistors (gate length and width), but depends on the supply voltage $V_{dd}$, which has to be sufficient. For TSMC technology, and taking $V_{dd}$=200 mV, Gv≈5. The variation of the sodium current as a function of the variation of $V_{mem}$ will thus be of the order of $$\left[\left(\frac{90}{5}\right) = 18\right]$$

mV per decade of current, which is close to biology. For the potassium current, the effect will be even greater, because it is the voltage gain of the two inverters to which consideration is to be given.

FIG. 3B shows a variant of a Morris-Lecar neuron core ML-N-C, which differs from that of FIG. 3A through the addition of a third inverter 47, the first inverter 48 transmitting the output potential, after inversion, to the gate of the PMOS transistor 4 of the bridge, and the other two inverters 46 and 47, linked in cascade, transmitting the output potential to the gate of the NMOS transistor 5.

The inputs of the inverters 46 and 48 are linked to the membrane potential and to the integration capacitor, and the input of the inverter 47 is linked to the output of the inverter 46.

The addition of the third inverter makes it possible to independently optimize the commanding of the transistors of the bridge, by independently adjusting the threshold voltages of the inverters.

FIG. 4 illustrates an example of a core "AH-N-C" of an Axon-Hillock neuron that includes two inverters in cascade 8 and 9, a feedback capacitor $C_f$ connected in parallel with these inverters and an NMOS transistor 10 whose drain defines the membrane potential $V_{mem}$, whose source is connected to ground and whose gate is linked to the output of the inverters 8 and 9. This neuron may also include a membrane capacitance $C_{mem}$ connected between the input of the first inverter 8 and ground, and shown in dashed lines in FIG. 4.

It should be emphasized that the two inverters 8 and 9 of the core AH-N-C perform the same role as that described above for the ML-N-C. However, the waveforms obtained for the membrane voltage with the core AH-N-C are further from biology than the core ML-N-C.

FIG. 5 shows a first embodiment of a neural circuit 1 according to the invention. This circuit includes a pre-neuron Pre-N and a post-neuron Post-N that are linked to one another by a synapse S. Said synapse is formed of two CMOS transistors in series and linked by their drains: a PMOS transistor 10 and an NMOS transistor 11. The gate of the PMOS transistor 10, forming the switching input of the synapse, is linked to the signal $VA_{out}$ bar coming from the pre-neuron Pre-N. The source of the transistor 10 is linked to the signal $V_{out}$. The gate of the NMOS transistor 11 defines the synaptic weight potential $V_w$, which may vary so as to express the plasticity of the synapse. The source of the transistor 11 goes to the input of the post-neuron Post-N such that the current Ids between drain and source forms an excitation current $I_{ex}$ for the post-neuron.

In static mode, when the pre-neuron does not generate an action potential, in other words when $VA_{out}$=0 V, the NMOS transistor 11 is practically transparent for the analysis of the operation, regardless of the synaptic weight potential $V_w$, because its drain-source voltage is virtually zero. As the Morris-Lecar post-neuron is not excited, its membrane voltage, which is positive, is of the order of a few ten mV. The voltage $V_{sd}$ of the PMOS transistor 10, as illustrated in FIG. 5, is thus negative, which means that source and drain may be inverted for the two transistors 10 and 11, as shown in FIG. 6. The current $I_{ex}$ is negative, and no action potential is able to be generated at the post-neuron, as the latter is at rest. The synapse is equivalent to an active load shown in FIG. 7, producing an inhibitor current $I_{inhib}$.

Digital simulations on the software LTspice were performed on the equivalent circuit of FIG. 6 and on the circuit of the conventional synapse of FIG. 1 in order to compare the currents $I_{inhib}$ and $I_{ex}$. For these simulations, $V_{dd}=V_w$=0.2 V and the length and the width of the gate of the transistors were set at 65 nm and 120 nm, respectively.

The results of these simulations gave a current $I_{inhib}$=10 fA against a current $I_{ex}$=2.5 pA, that is to say more than two orders of magnitude lower. The power dissipated by the synapse of FIG. 6 is equal to 0.15 fW, whereas that dissipated by the conventional synapse is equal to 0.45 pW. A synapse according to the invention may make it possible to reduce the dissipated power by more than 3 orders of magnitude in comparison with a conventional synapse.

It should be noted that, in the case of Axon-Hillock neurons without activity of a pre-neuron, the membrane voltage of said Axon-Hillock neuron is virtually zero, and in this case using a switched synapse with this or these Axon-Hillock neuron or neurons makes it possible to obtain a power that is virtually zero and, in any case, lower than that that would be obtained in a configuration implementing one or more Morris-Lecar neurons.

On the basis of the circuits of FIGS. 1 and 6, it is possible to confirm these values through calculation.

As equations for the drain currents Idp and Idn of the PMOS and NMOS transistors, respectively, we have:

$$Idp + Is' \cdot e^{\frac{Vsp_g}{n \cdot Vt}} \cdot \left(1 - e^{\frac{-Vsd_p}{Vt}}\right)$$

$$Idn = Is'' \cdot e^{\frac{Vgs_n}{n \cdot Vt}} \cdot \left(1 - e^{\frac{-Vds_n}{Vt}}\right)$$

Is' corresponds to the leakage current at saturation of the PMOS transistor ($V_{sg}=0$ V and $V_{sd}>5.V_t$).

Is" corresponds to the leakage current at saturation of the NMOS transistor $V_{gs}=0$ V and $V_{ds}>5. V_t$)

For the circuit of FIG. 1, when the pre-neuron does not generate an action potential, $Vsg_p=V_s-V_g=V_{dd}-VA_{out\,bar}=0$ V. $Vgs_n=V_{dd}-V_{mem}$, where V is equal to 25 mV (value given by the LTspice simulation). Hence $Vgs_n=175$ mV if $V_w=V_{dd}$.

As the currents Idp and Idn are identical, it results, from the respective values of $Vgs_p$ and $Vgs_n$, that the voltage $Vds_n$ of the NMOS is very low ($Vds_n<<1$ mV).

Neglecting the voltage $Vds_n$, $Vsd_p=V_{dd}-V_{mem}=175$ mV.

It results that $Iex=Idp \approx Is^i=2.5$ pA

The power dissipated in static mode by a conventional synapse is essentially due to the PMOS transistor: $P_{DC}=Vsd_p*Iex=0.45$ pW. It should be noted that, if $V_W=0$ V, the current flowing through the two transistors remains of the same order of magnitude, around 2 pA.

With regard to the circuit of FIG. 6, given the extremely low value of $I_{inhib}$, the membrane voltage of the post-neuron Post-N is close to 15 mV (value given by the LTspice simulation). Since $VA_{out\,bar}=0.2$ V, the voltage $Vsg_p$ of the transistor 10 will be between −0.2 V and −0.185 V, leading de facto to an extremely low current.

Since the currents Idp and Idn are identical, it results that the voltage $Vds_n$ is close to 0 V, regardless of the value of the weight $V_W$ Hence, $Vsg_p = (V_{mem} - VA_{out\,bar}) \approx (15 - 200)$ mV $\approx -185$ mV.

$Vsd_p = V_{mem} - VA_{out} \approx 15$ mV.

$Idp = Is' \cdot e^{\frac{-185}{40}} \cdot \left(1 - e^{\frac{-15}{25}}\right) \approx 4.4 \cdot 10^{-3} \cdot Is'(<10^{-2} \cdot Is')$ $Iinhib = 4.4 \cdot 10^{-3} \cdot Iex(SA\ \text{"standard"}) = 10\ fA$ Therefore, $I_{inhib}=4.4 \cdot 10^{-3} \cdot I_{ex}=10$ fA.

The power dissipated in static mode by the synapse is that of the PMOS transistor: $P_{DC}=Vsd_p*Idp=0.15$ fW.

The calculated values of the currents and powers do indeed correspond to those found by the digital simulations.

By simulating the circuit of FIG. 5 on LTspice, the pre-neuron was excited and the response of the excitation current Lex from the synapse, as well as the action potential of the post-neuron, were observed. The results of the waveforms obtained are reported in FIG. 8.

It is observed that, upon reaching of the action potential of the pre-neuron (the curve $V_{memA}$), the current $I_{ex}$ increases with a very high amplitude, triggering a slightly delayed action potential (curve $V_{memB}$) at the post-neuron.

These waveforms are similar to those obtained by replacing the synapse according to the invention with a conventional synapse according to FIG. 1.

Using 65 nm CMOS technology, by imposing a nominal gate length of 65 nm for the transistors, this is reflected in a synaptic current in dynamic mode, i.e. upon an action potential of the pre-neuron, which remains too high, even for the minimum gate width able to be produced (120 nm).

To control the synaptic current, an additional transistor 12 may be inserted in series between the transistors 10 and 11 of the synapse S, as shown in FIG. 9. This transistor 12 may indiscriminately be an NMOS or PMOS transistor. Its gate is linked to its drain or to its source via the link 11 or 12.

It should be noted that the dimensions of the transistors of FIG. 9 are elements that may contribute to adjusting the synaptic current.

Considering the circuit of FIG. 5, the duration of the excitatory post-synaptic potential (EPSP) is the same as that of the action potential of the pre-neuron. To increase the duration of the EPSP (for example up to 10 times the pulse width in relation to an action potential), the second embodiment of the invention illustrated in FIG. 10 puts two inverters 2' and 3' in cascade at the output of the core Pre-N-C of the pre-neuron, followed by an integrator 15 including an active load preferably formed of an NMOS transistor 13 whose gate and drain are linked to a capacitor 14 that is linked to ground.

The curves of $VA_{out}$, $VA_{out}$ bar and the voltage $V_1$ at the output of the integrator are illustrated in FIG. 11. This figure also shows the membrane potentials $V_{memA}$ and $V_{memB}$ of the pre-neuron and post-neuron, respectively. It is observed that the response to a single action potential of the pre-neuron is reflected in the presence of three action potentials for the post-neuron, due to $V_{out}$ being kept at $V_{dd}$ for an increased duration, by virtue of the integrator 15.

To express the STDP from an artificial point of view, FIG. 12A shows an example of a circuit 22 used to determine, at the point P1, the binary synaptic weight potential $V_w$ from the output voltages $VA_{out}$ and $VB_{out}$ of the pre-neuron and post-neuron, respectively. This circuit 22 comprises an STDP learning circuit 23 generating what is called an analogue synaptic weight potential $V_{w\ analogue}$, which goes to the input of a SRAM-based memory circuit 24 in order to produce the binary synaptic weight potential $V_w$. The STDP learning circuit includes firstly a PMOS transistor 19 supplied with $VA_{out}$ and charging a capacitor 21, and secondly two PMOS transistors 17 and 18 in series charging a capacitor 20, an inverter 16 linking the drain of the transistor 19 to the gate of the transistor 18. The transistor 17 is supplied with $VB_{out}$ and has its gate connected to $VB_{out}$ bar, the complementary state of $VB_{out}$. Upon the arrival of an action potential of the pre-neuron that is ahead with respect to that of the post-neuron, the analogue synaptic weight voltage $V_{w\ analogue}$ across the terminals of the capacitor 20 increases. This voltage is sent to the SRAM-based memory circuit 24 before the capacitor 20 discharges in the absence of an action potential. The SRAM-based memory circuit 24 comprises firstly a SRAM cell whose output is the binary synaptic weight potential $V_w$ and including two inverters 25, 26, the input of one of which is connected to the output of the other, and secondly two CMOS transistors 27, 28 whose drain-source channels are in series, receiving the analogue voltage $V_{w\_analogue}$ on the gate of one of them, the drain or the source thereof defining the input of the SRAM cell, and receiving the voltage $VB_{out}$ on the other.

If the analogue synaptic weight voltage $V_{w\_analogue}$ is higher than a previously set threshold voltage of the SRAM memory, the binary synaptic weight potential $V_w$ switches from 0 to $V_{dd}$. For a given time interval between the action potential of the pre-neuron and that of the post-neuron, characterizing the delay of the action potential of the post-neuron with respect to the pre-neuron, a certain amount of pairing (pairs of pre-neuron and post-neuron action potentials) should be expected so that $V_w$ switches from 0 V to $V_{dd}$; for another longer time interval, the amount of pairing required will be greater.

That which has just been described applies to the case of an excitatory synapse, but it should be noted that a symmetrical connection with the voltages $VA_{out}$ and $VB_{out}$ swapped may be used to control the plasticity of an inhibitory synapse, as illustrated in FIG. 12B. In this case, the weight $V_{w\_inhib}$ is tapped off at the connection point P2 opposite $V_w$ of the inverters of the SRAM.

When there is no action potential, $VB_{out}$=0 V and $VB_{out\_bar}$=$V_{dd}$. The same phenomenon is observed as that of the switched synapse shown in FIG. 6, in which drain and source are inverted. Drain and source of the transistors 17 and 18 are thus inverted and the capacitor 20 discharges through these transistors. The gate leakage at the transistor 27 is negligible in comparison with that of the transistors 17 and 18. It should be noted that, beforehand, if a pair of pre-neuron/post-neuron action potentials has been generated with the action potential of the pre-neuron ahead of that of the post-neuron, the SRAM memory has switched and kept its weight, even if the capacitor 20 discharges.

FIG. 13 corresponds to the circuit diagram of the circuit AH-N-C illustrated in FIG. 4 produced using 65 nm CMOS technology. The inverter 8 is formed of the transistors M1 and M2. The inverter 9 is formed of the transistors M3 and M4. For practical reasons (i.e. saving a pad in the layout), a single power supply $V_{dd}$=0.2 V supplies AH-N-C and the transconductance M11 that is used to excite same.

For the simulation of the circuit, all of the gate widths of the transistors were set at 120 nm. All of the gate lengths were set at 65 nm, and the capacitance $C_f$ was set at fF.

The waveforms obtained through simulation are illustrated in FIG. 14. As may be seen, an effect of the sizing of the circuit is reflected in an output voltage $V_{out}'$ that does not reach $V_{dd}$. It reaches 140 mV. It should be noted that the inverters 2 and 3 make it possible to boost the level of the output voltage to $V_{dd}$=200 mV.

FIG. 15 shows the experimental curves of consumed power P in pW and frequency f in kHz of the action potentials coming from $V_{out}'$, as a function of the total current I delivered by the power supply in pA. To vary the frequency, the voltage Vdd2 of the assembly of FIG. 13 is acted upon.

It is noted that, in static mode (f=0), the consumed power is slightly greater than 10 pW. For the measured circuit, the maximum frequency of the action potentials is 16 kHz. At this maximum frequency, the consumed power is 32 pW. This power value is very close to that in static mode of the Morris-Lecar neuron.

It should be noted that the consumed power of the thus-dimensioned circuit AH-N-C is lower in reality, because the total current I takes into account the excitation current.

The energy, extracted experimentally by taking into account the static and dynamic powers, in fJ per action potential is shown in FIG. 16 as a function of the frequency in kHz of the action potentials.

By virtue of the dimensioning of the circuit AH-N-C, an energy efficiency of around 2 fJ per action potential is obtained. A better value would be obtained if the contribution of the excitation current were to be deducted. This energy efficiency is better than for a circuit ML-N-C. The reason is linked to the fact that the architecture of the neuron AH-N-C comprises only 5 transistors, and a single capacitor. Using a single capacitor proves useful for gaining silicon occupation surface area and facilitates miniaturization of the circuit.

The thus-dimensioned circuit AH-N-C also makes it possible to achieve all of the functionalities outlined in application FR 3 050 050 in respect of the Morris-Lecar neuron, namely compatibility with excitatory and inhibitory synapses, emulation of burst mode and stochastic resonance.

FIG. 17 illustrates an inhibitory synapse, which may form part of the neural circuit according to the invention, comprising two CMOS transistors, preferably NMOS transistors, 30, 31, whose drain-source channels are in series. The transistor 30 has its gate connected to the output voltage $VA_{out}$ of the pre-neuron, its source connected to ground and its drain connected to the source of the other transistor 31. Said other transistor has its gate connected to a synaptic weight potential $V_w$ and its drain connected to the membrane potential of the post-neuron.

The artificial synapse according to the invention may serve in neuroinspired systems for processing information, in particular in image and video processing and in facial recognition. In this case, the elements of the neural circuit will be optimized for great speed and/or very low dissipated power.

Moreover, the neural circuit according to the invention may be used in biomedical applications, as an artificial biological synapse (implant).

The invention claimed is:

1. An electronic neural circuit including at least one pre-neuron having an action potential output $VA_{out}$, and at least one post-neuron that are linked by at least one excitatory synapse having at least one switching input and a supplying input, different from said switching input, wherein the supplying input is connected to the output $VA_{out}$ and wherein said switching input is connected to a switching output of said post-neuron whose state complementary to said output $VA_{out}$.

2. The circuit according to claim 1, wherein the excitatory synapse comprises at least two field-effect transistors, whose drain-source channels are in series, so as to form a chain of transistors in series between a potential point connected to $VA_{out}$ and a potential point connected to the membrane potential of the post-neuron, the transistors situated at the ends of the chain being termed "end transistors".

3. The circuit according to claim 2, wherein the end transistor is connected to $VA_{out}$ being a PMOS transistor.

4. The circuit according to claim 3, wherein the end transistor is connected to the membrane potential ($V_{memB}$) of the post-neuron being an NMOS transistor.

5. The circuit according to claim 2, wherein the chain of transistors comprises only two transistors that form the end transistors, these transistors having their sources at the same potential when $VA_{out}$=0.

13

6. The circuit according to claim 2, wherein one of the end transistors comprises a gate defining the switching input and the other end transistor having a gate defining a synaptic weight potential input.

7. The circuit according to claim 6, wherein a synaptic weight potential, applied to the synaptic weight potential input, takes an appropriate value from among $V_{dd}$ and 0 when the circuit is supplied with a voltage $V_{dd}$.

8. The circuit according to claim 2, further comprising at least one third intermediate field-effect transistor, belonging to the chain of transistors, and positioned between said end transistors, the gate of the third transistor being linked to the drain or to the source of one of the end transistors.

9. The circuit according to claim 1, wherein the supply voltage $V_{dd}$ of said circuit being such that $0<V_{dd}<0.3$ V.

10. The circuit according to claim 1, wherein the pre-neuron includes two inverters in cascade, called first and second conforming inverters, respectively generating $VA_{out\_}$ bar and $VA_{out}$.

11. The circuit according to claim 6, wherein the binary synaptic weight potential applied to the synaptic weight potential input is obtained at the output of a synaptic weight determination circuit, this synaptic weight determination circuit comprising:
A memory circuit, having an analogue voltage $V_{w\ analogue}$ for its input and the binary synaptic weight potential for its output, and including:
  a memory cell including two inverters, the input of one of which is connected to the output of the other, whose output is a connection point defining the binary synaptic weight potential,
  two field-effect transistors whose drain-source channels are in series, receiving the analogue voltage $V_{w\ analogue}$ on the gate of one of them, and the drain or the source thereof defining the input of the memory cell, and receiving the output potential $VB_{out}$ of the post-neuron on the gate of the other transistor
a learning circuit called STDP ("spike timing dependent plasticity").

12. The circuit according to claim 11, further comprising a symmetric replica of the synaptic weight determination circuit in which the potentials $VA_{out}$ and $VB_{out}$ are swapped, the symmetry being with respect to the memory cell that is shared in common between the synaptic weight determination circuit and its replica, a binary synaptic weight potential applied to a synaptic weight potential input of an inhibitory synapse being tapped off at a connection point opposite the connection point that defines the binary synaptic weight potential of the excitatory synapse.

13. The circuit according to claim 1, wherein the pre-neuron comprises an extension sub-circuit including two inverters in cascade, called coupling inverters, followed by an integrator circuit comprising a field-effect transistor, the gate of the transistor being linked to the drain forming the output of the two coupling inverters in cascade, the source of the transistor being linked to a first terminal of the capacitor whose second terminal is linked to ground, the output of the extension sub-circuit being linked to the input of the first conforming inverter.

14. The circuit according to claim 13, wherein the transistor of the extension sub-circuit is a CMOS transistor.

15. The circuit according to claim 1, wherein at least one of the pre-neuron and post-neuron is a Morris-Lecar type pre-neuron and/or post-neuron.

16. The circuit according to claim 1, wherein at least one of the pre-neuron and post-neuron is an Axon-Hillock type pre-neuron and/or post-neuron.

14

17. The circuit according to claim 10, wherein the input of the first conforming inverter is connected to the membrane potential.

18. The circuit according to claim 15, the gate widths of the transistors of the pre-neuron and/or post-neuron being between 60 nm and 10 μm, the gate lengths of these transistors being between 10 nm and 10 μm.

19. The circuit according to claim 15, further comprising:
at least two inverters in cascade,
a feedback capacitor connected in parallel with said at least two inverters in cascade,
the feedback capacitance being between 1 fF and 1 pF.

20. The circuit according to claim 14, including:
a capacitor, called membrane capacitance, one of the terminals of which defines a membrane potential,
a pulse feedback circuit including:
  a bridge of field-effect transistors, in series and linked to the membrane potential by way of their drains, and
  at least one capacitor, called delay capacitor, between the gate and the source of one of the transistors of the bridge,
the membrane and delay capacitances are between 1 fF and 1 pF.

21. The circuit according to claim 1, furthermore including at least one inhibitory synapse comprising at least two field-effect transistors whose drain-source channels are in series, one of the two transistors having its gate connected to the output $VA_{out}$ of the pre-neuron, its source connected to ground and its drain connected to the source of the other transistor, the latter having its gate connected to a synaptic weight potential and its drain connected to the membrane potential of the post-neuron.

22. The circuit according to claim 11, the learning circuit including:
Two field-effect transistors linked in series, the first transistor having the source connected to the output potential $VB_{out}$ of the post-neuron, the gate connected to a complementary state $VB_{out}$ bar of this potential and the drain connected to the source of the second transistor, whose drain is connected to a terminal of a first capacitor integrating the synaptic weight potential, the other terminal of this first capacitor being linked to ground, the drain of the second transistor supplying the analogue voltage $V_{w\ analogue}$ to the memory circuit,
a third field-effect transistor whose source is linked to the potential $VA_{out}$ of the pre-neuron, whose gate is linked to ground and whose drain is linked to a terminal of a second capacitor whose other terminal is linked to ground, and
an inverter whose input is linked to the drain of the third transistor and whose output is linked to the gate of the second transistor.

23. The circuit according to claim 15, wherein the Morris-Lecar type pre-neuron and/or post-neuron comprises:
a capacitor, called membrane capacitance, one of the terminals of which defines a membrane potential,
a pulse feedback circuit including:
  a bridge of field-effect transistors in series and linked to the membrane potential by way of their drains, and
  at least one capacitor, called delay capacitor, between the gate and the source of one of the transistors of the bridge, and
at least two field-effect inverters, in cascade, each one being formed of two transistors, the input of the first inverter being linked to the membrane capacitance and its output being linked to the input of the second inverter and to the gate of one of the transistors of the bridge, the output of the second inverter being linked to the gate of the other transistor of the bridge, or at least three field-effect inverters two inverters of which are in cascade, each one being formed of two transistors, the input of the first inverter being linked to the membrane capacitance and its output being linked to the input of the second inverter, the output of the second inverter being linked to the gate of one of the transistors of the bridge, the input of the third inverter being linked to the membrane capacitance and the output of the third CMOS inverter being linked to the gate of the other transistor of the bridge.

24. The circuit according to claim 15, wherein the Morris-Lecar type pre-neuron and/or post-neuron comprises:

a capacitor, called membrane capacitance, one of the terminals of which defines a membrane potential, a pulse feedback circuit including:

a bridge of field-effect transistors in series and linked to the membrane potential by way of their drains, and at least one capacitor, called delay capacitor, between the gate and the source of one of the transistors of the bridge, and at least two field-effect inverters, in cascade, each one being formed of two transistors, the input of the first inverter being linked to the membrane capacitance and its output being linked to the input of the second inverter and to the gate of one of the transistors of the bridge, the output of the second inverter being linked to the gate of the other transistor of the bridge, or at least three field-effect inverters two inverters of which are in cascade, each one being formed of two transistors, the input of the first inverter being linked to the membrane capacitance and its output being linked to the input of the second inverter, the output of the second inverter being linked to the gate of one of the transistors of the bridge, the input of the third inverter being linked to the membrane capacitance and the output of the third CMOS inverter being linked to the gate of the other transistor of the bridge.

* * * * *